(12) United States Patent
Sakuma et al.

(10) Patent No.: US 12,745,683 B2
(45) Date of Patent: Sep. 22, 2026

(54) MULTI-CHIP HIGH MEMORY BANDWIDTH CONFIGURATION

(71) Applicant: INTERNATIONAL BUSINESS MACHINES CORPORATION, Armonk, NY (US)

(72) Inventors: Katsuyuki Sakuma, Fishkill, NY (US); Mukta Ghate Farooq, Hopewell Junction, NY (US); Ramachandra Divakaruni, Ossining, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 709 days.

(21) Appl. No.: 17/555,489

(22) Filed: Dec. 19, 2021

(65) Prior Publication Data

US 2023/0197595 A1 Jun. 22, 2023

(51) Int. Cl.
*H10W 90/00* (2026.01)
*H10W 70/05* (2026.01)
(Continued)

(52) U.S. Cl.
CPC ......... *H10W 90/401* (2026.01); *H10W 70/05* (2026.01); *H10W 70/611* (2026.01);
(Continued)

(58) Field of Classification Search
CPC ........... H01L 23/49833; H01L 21/4857; H01L 23/13; H01L 23/145; H01L 23/49816; H01L 23/49822; H01L 23/5385; H01L 24/16; H01L 24/81; H01L 25/0652; H01L 2224/16225; H01L 2224/81815; H01L 2225/06517; H01L 2225/0652; H01L 2225/06589; H01L 2924/1432; H01L 2924/1433; H01L 2924/14361; H01L 2225/06524; H01L 2225/06572;
(Continued)

(56) References Cited

U.S. PATENT DOCUMENTS 8,411,459 B2 4/2013 Yu et al.
8,519,537 B2 8/2013 Jeng et al.
(Continued)

FOREIGN PATENT DOCUMENTS

KR 101614132 B1 4/2016
TW I534981 B 5/2016

*Primary Examiner* — Benjamin Tzu-Hung Liu
(74) *Attorney, Agent, or Firm* — Yuanmin Cai

(57) ABSTRACT

A packaged device that carries multiple component devices uses a back-mounted structure to reduce the area of the substrates in the package. The package includes a first organic laminate substrate and a second organic laminate substrate. The first organic laminate substrate is the base substrate of the packaged device. The second organic laminate substrate has higher wiring density than the first organic laminate substrate. The second organic laminate substrate is joined to a top surface (or module mounting side) of the first organic laminate substrate. A first component device is mounted on a top surface of the second organic laminate substrate. A second component device is mounted on a bottom surface of the second organic laminate substrate. The second component device recesses into a cavity at the top surface of the first organic laminate substrate.

20 Claims, 5 Drawing Sheets

(51) Int. Cl.

| | |
|---|---|
| ***H10W 70/60*** | (2026.01) |
| ***H10W 70/68*** | (2026.01) |
| ***H10W 70/685*** | (2026.01) |
| ***H10W 70/695*** | (2026.01) |
| ***H10W 72/00*** | (2026.01) |
| ***H10W 90/20*** | (2026.01) |

(52) U.S. Cl.

CPC ......... *H10W 70/68* (2026.01); *H10W 70/685* (2026.01); *H10W 70/695* (2026.01); *H10W 72/07236* (2026.01); *H10W 90/00* (2026.01); *H10W 90/701* (2026.01); *H10W 90/288* (2026.01); *H10W 90/721* (2026.01); *H10W 90/724* (2026.01)

(58) Field of Classification Search

CPC ......... H01L 2225/1094; H01L 23/3675; H01L 23/5383; H01L 2225/1058; H01L 25/18; H01L 25/105; H10W 90/401; H10W 70/05; H10W 70/611; H10W 70/68; H10W 70/685; H10W 70/695; H10W 90/00; H10W 90/701; H10W 72/07236; H10W 90/288; H10W 90/721; H10W 90/724

See application file for complete search history.

(56) References Cited

U.S. PATENT DOCUMENTS

| | | | | |
|---|---|---|---|---|
| 9,859,267 | B2 | 1/2018 | Hou et al. | |
| 10,410,940 | B2 | 9/2019 | Akkinepally | |
| 2014/0374900 | A1 | 12/2014 | Kwon et al. | |
| 2016/0372448 | A1 | 12/2016 | Yazdani | |
| 2017/0243845 | A1* | 8/2017 | Lee | H10P 54/00 |
| 2018/0233452 | A1* | 8/2018 | Lin | H10W 20/435 |
| 2020/0075567 | A1* | 3/2020 | Collins | H01L 23/5389 |
| 2020/0126950 | A1* | 4/2020 | Lunde | H10W 40/22 |
| 2021/0074600 | A1* | 3/2021 | Jeng | H01L 21/486 |
| 2021/0249952 | A1* | 8/2021 | Roth | H02M 3/003 |
| 2022/0223530 | A1* | 7/2022 | Yu | H01L 23/5383 |

* cited by examiner 400
441
HBM
431
433
HBM
443
442
HBM
432
434
HBM
444
420

400
ASIC/
GPU/
CPU
433
434
ASIC/
GPU/
CPU
435
Hub Chip
ASIC/
GPU/
CPU
431
432
ASIC/
GPU/
CPU
430
420
410

400
430
431
A/G/C
435
Hub Chip
A/G/C
432
420
410
441
451
452
442

MULTI-CHIP HIGH MEMORY BANDWIDTH CONFIGURATION

BACKGROUND

Technical Field

The present disclosure generally relates to packaging of integrated circuits.

Description of the Related Arts

Integrated circuit (IC) packaging is the final stage of semiconductor device fabrication, in which semiconductor material is encapsulated in a supporting case that prevents physical damage and corrosion. Packaging supports the electrical contacts that connect the device to a substrate such as an organic laminate or a printed circuit board (PCB). A packaging substrate is used to package bare IC chips by acting as the connection between IC chip and an organic laminate or a PCB through a conductive network of wires and holes. The packaging substrate protects, reinforces, and supports IC chips. The substrate also provides heat dissipation and signal distribution. A laminate substrate is a substrate that is constructed of multiple thin layers stacked to form a rigid substrate. High Density Interconnect (HDI) laminate is an organic laminate substrate with a higher wiring density per unit area than a conventional laminate or a PCB. HDI laminates are made through microvias, plate through hole (PTH), core material, buried vias, sequential lamination with insulation materials (build up layers), and conductor wiring for higher density of routing.

SUMMARY

Some embodiments of the disclosure provide a packaged device that carries multiple component devices, which may be integrated circuits (ICs), chips, or chip stacks. The packaged device uses a back-mounted structure to reduce the area of the substrates in the package. The package includes a first organic laminate substrate and a second organic laminate substrate. The first organic laminate substrate is the base substrate of the packaged device. The second organic laminate substrate has higher wiring density than the first organic laminate substrate. The second organic laminate substrate is joined to a top surface (or module mounting side) of the first organic laminate substrate. A first component device is mounted on a top surface of the second organic laminate substrate. A second component device is mounted on a bottom surface of the second organic laminate substrate. The second component device recesses into a cavity at the top surface of the first organic laminate substrate.

In some embodiments, the first organic laminate substrate is a laminate that includes a set of standard build-up layers, and the second organic laminate substrate is a high-density interconnect (HDI) laminate. The first component device may be mounted on the second organic laminate substrate at a fan out wafer level package (FOWLP) with a fine pitch redistribution layer (RDL).

In some embodiments, the cavity is sized to match or accommodate the dimensions of the second component device. In some embodiments, the cavity has a pillar that supplies power to the second organic laminate substrate from the first organic laminate substrate. In some embodiments, the first organic laminate substrate has a heat conducting path that is configured to dissipate heat from the first cavity emitted by the second component device. The second component device may have a lower power density than the first component device.

In some embodiments, the second component device is mounted at a position of the second organic laminate substrate that overlaps the first component device at the opposite side. In some embodiments, the second component device provides memory storage for the first component device. For example, the second component device may be a high bandwidth memory (HBM) and the first component device may be a central processing unit (CPU) or graphical processing unit (GPU). In some embodiments, the second component device is a chip stack that includes multiple integrated circuits (ICs). The second component may be thinner than the first component device.

By using a back-mounted structure, the area of the laminate can be reduced. In addition, by mounting the memory chips (e.g., High bandwidth memory or HBMs) and the processing chips (CPUs/GPUs/ASICs) on the opposite side of the high-density laminate, the power constraint of the memory chips and the processing chips can be decoupled. The back-mounted structure also shortens the access paths from the processing chips to the memory chips since the memory chips are positioned right beneath the processing chips at the opposite side. This packaging technique also facilitates design of artificial intelligence/machine learning systems, whose processing units may involve fine-grain access to high-density memories.

The preceding Summary is intended to serve as a brief introduction to some embodiments of the disclosure. It is not meant to be an introduction or overview of all inventive subject matter disclosed in this document. The Detailed Description that follows and the Drawings that are referred to in the Detailed Description will further describe the embodiments described in the Summary as well as other embodiments. Accordingly, to understand all the embodiments described by this document, a Summary, Detailed Description and the Drawings are provided. Moreover, the claimed subject matter is not to be limited by the illustrative details in the Summary, Detailed Description, and the Drawings, but rather is to be defined by the appended claims, because the claimed subject matter can be embodied in other specific forms without departing from the spirit of the subject matter.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

DETAILED DESCRIPTION

In the following detailed description, numerous specific details are set forth by way of examples in order to provide a thorough understanding of the relevant teachings. However, it should be apparent that the present teachings may be practiced without such details. In other instances, well-known methods, procedures, components, and/or circuitry have been described at a relatively high-level, without detail, in order to avoid unnecessarily obscuring aspects of the present teachings.

Figure 1:
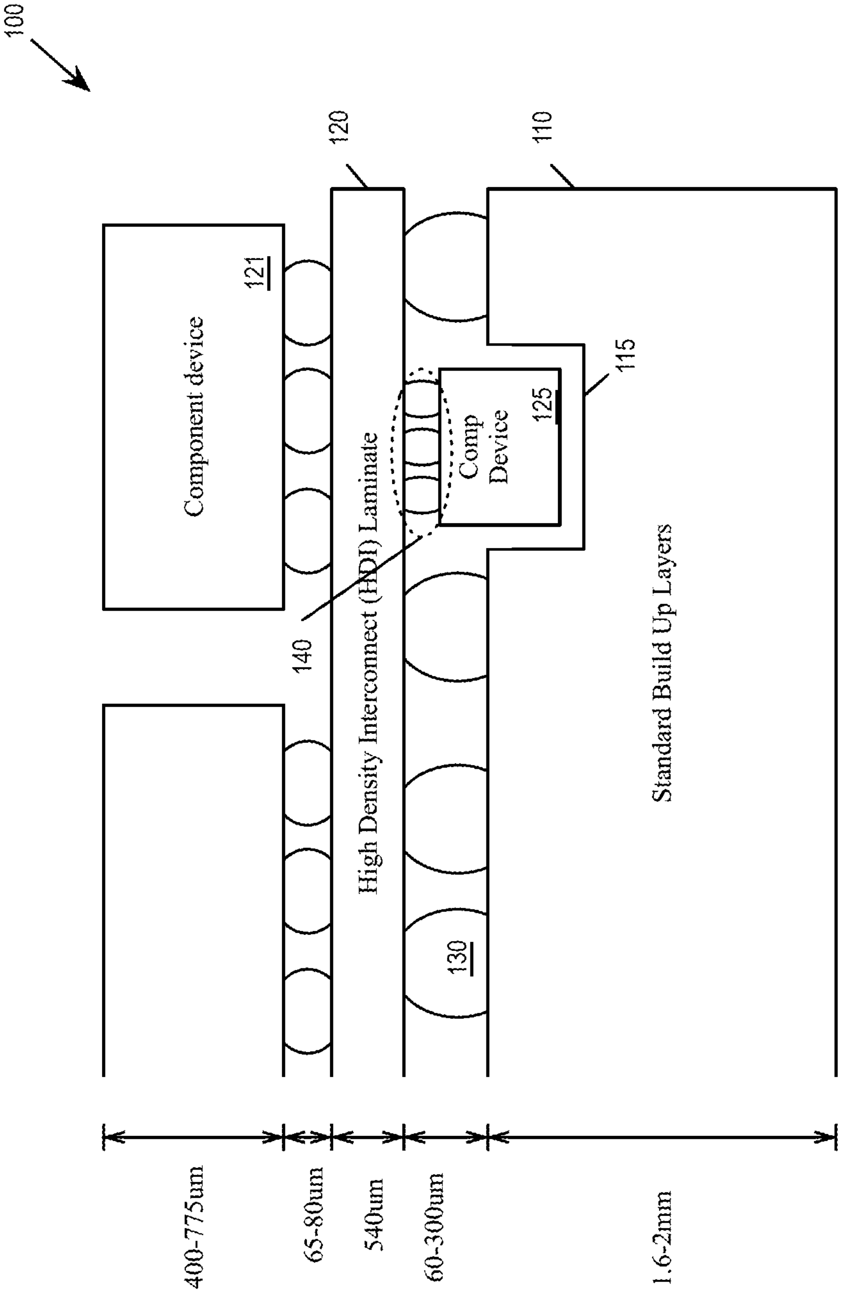
FIG. 1 illustrates a packaged device that uses a back-mounted structure to reduce the area of the substrates in the package, consistent with an exemplary embodiment.

Some embodiments of the disclosure provide a packaged device that carries multiple component devices, which may be integrated circuits (ICs), chips, or chip stacks. The packaged device uses a back-mounted structure to reduce the area of the substrates in the package. FIG. 1 illustrates a packaged device 100 that uses a back-mounted structure to reduce the area of the substrates in the package, consistent with an exemplary embodiment. As illustrated, the package 100 includes a first organic laminate substrate 110 and a second organic laminate substrate 120. The first organic laminate substrate 110 is the base substrate of the packaged device 100. The second organic laminate substrate 120 has higher wiring density than the first organic laminate substrate 110. The second organic laminate substrate 120 is mounted on or joined to a top surface (or module mounting side) of the first organic laminate substrate 110. (The second organic laminate substrate may be joined to the top surface of the first organic laminate substrate by soldering, the soldering may be a full melt solder between the two components, or a solder attached to the tip of a copper pillar or another structure is on the second organic substrate laminate.)

A first component device 121 is mounted on a top surface of the second organic laminate substrate. A second component device 125 is mounted on a bottom surface of the second organic laminate substrate. The second component device 125 recesses into a cavity 115 at the top surface of the first organic laminate substrate.

In some embodiments, the second organic laminate substrate 120 is a high-density interconnect (HDI) laminate with higher wiring density per unit area than a conventional organic laminate and a conventional PCB, while the first organic laminate substrate is a laminate of a set of standard build-up layers. The back-mounted structure and the higher density of second organic laminate substrate 120 allows the second organic laminate substrate to be smaller, which in turn reduces the overall size of the packaged device.

The cavity 115 is formed according to the size and the height of the second, bottom-mounted component device 125 so the thickness of the second component device can be recessed into the first organic laminate substrate 110. This enables the second, higher density substrate to be mounted closer to the first, lower density substrate. For example, the second component 125 may be 775 um thick even though the space separating the first and second organic laminate substrate is only 60 um to 300 um. Having the cavity to recess the second component also allows higher density connectors or connection type between the first and second organic laminate substrate. For example, the second, higher density substrate can be soldered onto the first, lower density substrate using control collapse of chip connection (C4) and ball grid array (BGA).

In some embodiments, the second component device is a chip stack that includes multiple ICs. In some embodiments, the second component device 125 is constrained to be thinner than at least one component device mounted at the top of the second organic laminate substrate 120 (e.g., the first component device 121.) For example, the second component device 125 may be a chip stack that is 720 um thick, while the first component device 121 may be 775 um thick.

In some embodiments, the second organic laminate substrate may have different connectors or connection types with different component devices or with other substrates. For example, connection type of the component device 125 to the bottom of the second organic laminate substrate 120 may be different than that of the component device 121 to the top of the second organic laminate substrate 120. Furthermore, the connection type between the second organic laminate substrate 120 and the first organic laminate substrate 110 may be further different still. For example, the connectors 130 between the second organic laminate substrate 120 and the first organic laminate substrate 110 may be solder balls with 200 um in height (C4 and BGA), while the connectors 140 between the component device 125 to the second organic laminate substrate 120 may be microbumps with 55 um to 75 um pitch.

The higher density substrate (the second organic laminate substrate) may carry multiple component devices. In some embodiments, the higher density substrate may mount multiple component devices at its bottom surface (the side that faces the lower density substate), and the lower density substrate (the first organic laminate substrate) have multiple cavities or a large cavity to recess the multiple back-mounted component devices. In some embodiments, an intermediate fan out wafer level package (FOWLP) with fine (pitch) redistribution layer (RDL) may be used to mount multiple component devices to the top surface of the higher density substrate. In some other embodiments, the component device mounted at the top surface of the higher level density substrate 120 is a FOWLP with RDL with multiple mounted ICs. FOWLP provides a smaller package footprint along with improved thermal and electrical performance compared to conventional packages, and allows having higher number of contacts without increasing the die size. RDL is an extra metal layer on a chip that makes the IO pads of an IC available in other locations of the chip or even outside of the chip, for better access to the pads where necessary.

Figure 2:
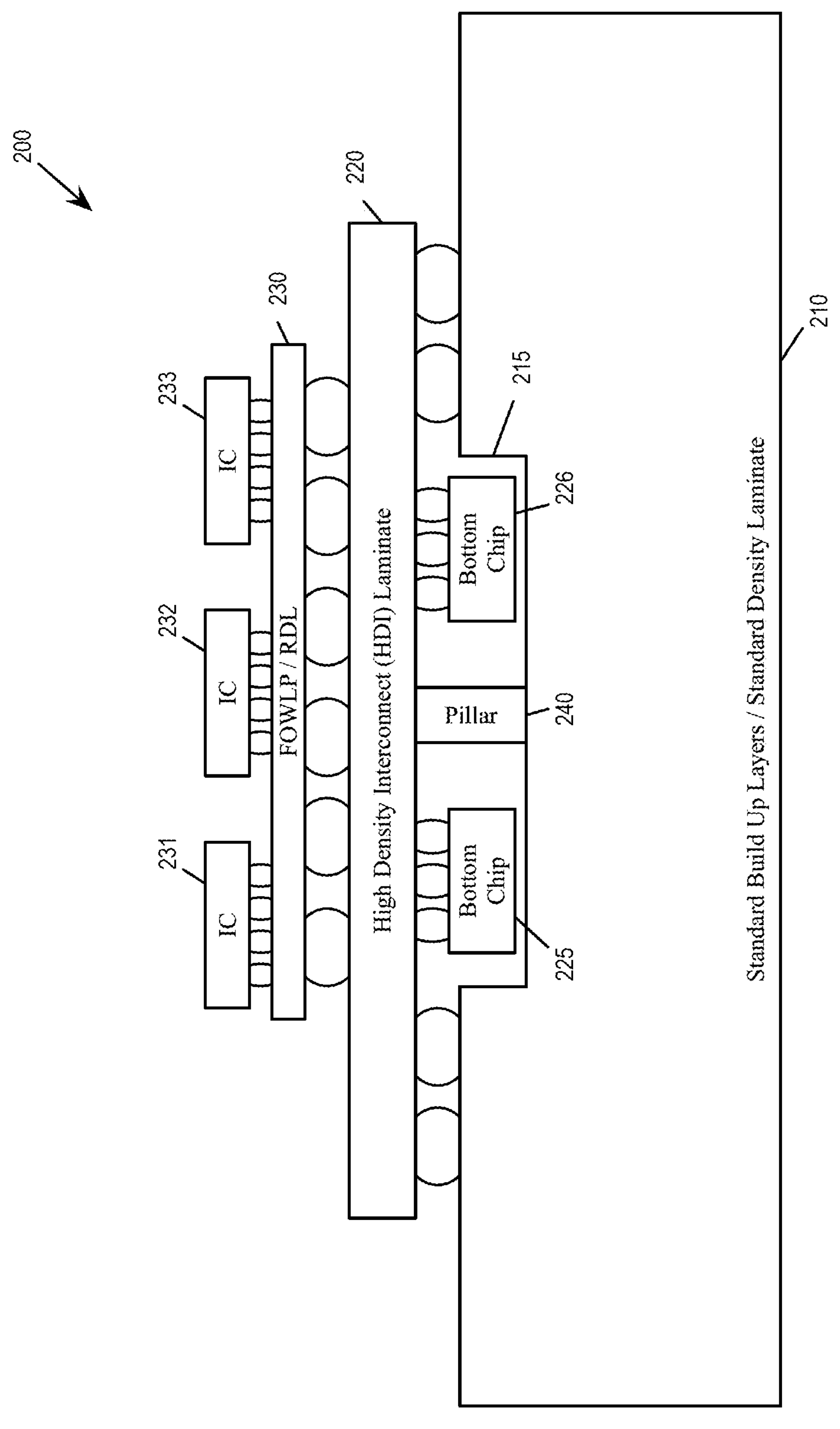
FIG. 2 illustrates a packaged device in which the higher density substrate carries multiple component devices at both surfaces, consistent with an illustrative embodiment.

FIG. 2 illustrates a packaged device 200 in which the higher density substrate carries multiple component devices at both surfaces. As illustrated, the package 200 includes a lower or standard density organic laminate substrate 210 and a higher density organic laminate substrate 220. The higher density substrate 220 is soldered onto the top surface (or module mounting side) of the lower/standard density substrate 210. A FOWLP structure 230 is mounted on the top surface of the higher density substrate. Several ICs 231, 232, and 233 are mounted on the FOWLP structure 230. Component devices 225 and 226 are mounted on the bottom surface of the higher density substrate. The component devices 225 and 226 recess into a cavity 215 at the top surface of the standard density substrate 210. The cavity 215 is sized to recess both the component devices 225 and 226. A pillar 240 is installed in the cavity 215 to support the structure of the packaged device. In some embodiments, the pillar is made of copper (Cu). In some embodiments, the pillar is made of tall C4 solder. In some embodiments, the pillar is used to provide power to the higher density laminate 220 and the ICs 231-233 through the C4 connections and the FOWLP 230.

In some embodiments, the standard or lower density substrate provides a heat conducting path for the component device (e.g., device 125, 225, or 226) mounted at the bottom of the higher density substrate. In some embodiments, the heat conducting path contacts the bottom-mounted component device at the cavity that recesses the component device. Thus, the bottom-mounted component device can be properly cooled even though it is sandwiched between the two substrates.

Figure 3:
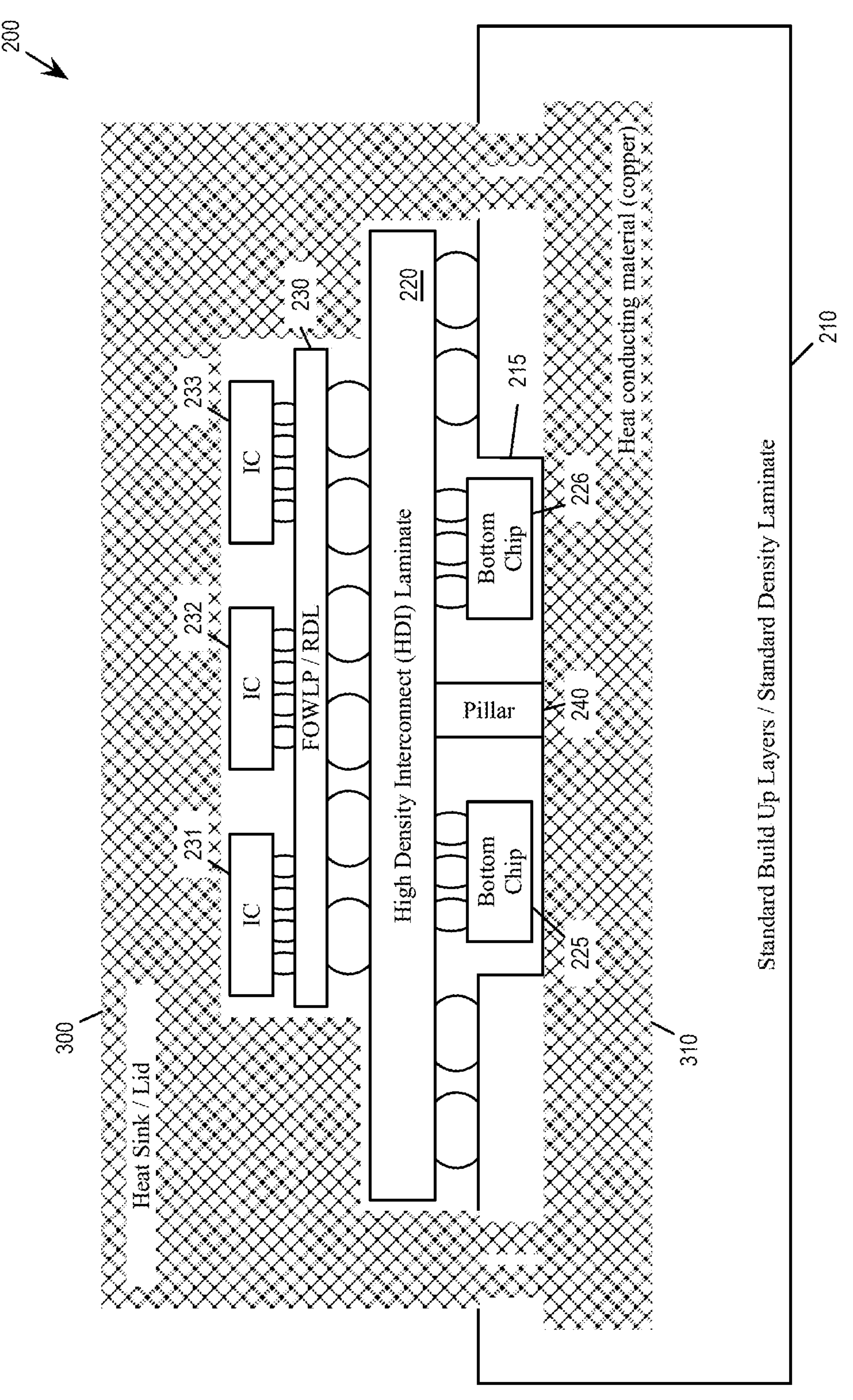
FIG. 3 illustrates a heat dissipation scheme of the packet device, consistent with an illustrative embodiment.

FIG. 3 illustrates a heat dissipation scheme of the packet device 200. Specifically, a heat sink 300 is installed over the packaged device 200 to dissipate heat generated by the top-mounted components of the higher density substrate, while a heat conducting path 310 is installed in the standard density substrate 210 to dissipate heat generated by the bottom-mounted components of the higher density substrate.

As illustrated, the heat conducting path 310 traverses through the cavity 215 to contact the component devices 225 and 226. In some embodiments, the heat conducting path 310 is constructed using heat conducting material such as copper. The heat conducting path 310 thus dissipates the heat emitted by the component devices 225 and 226, even though the components 225 and 226 are back-mounted to the high density substrate 220 and sandwiched in by the standard density substrate 210. In some embodiments, the back-mounted component devices 225 and 226 have a lower power density than the component devices mounted at the top surface of the higher density substrate.

In some embodiments, the back- or bottom- mounted component devices 225 and 226 are used to provide memory storage for the top-mounted component devices 231-233. For example, the bottom-mounted component devices may be HBMs (high bandwidth memories) and the top-mounted component devices may be central processing units (CPUs), graphical processing units (GPUs), or application-specific ICs (ASICs). The higher density substrate provides the interconnection between the processing units (CPUs/GPUs/ASICs) at the top and the HBMs at the bottom. HBM is a high-speed computer memory interface for 3D-stacked synchronous dynamic random-access memory (SDRM). It is used in conjunction with high-performance graphics accelerators, network devices, high-performance datacenter, artificial intelligence circuits, and supercomputers.

Figures 4A, 4B, 4C:
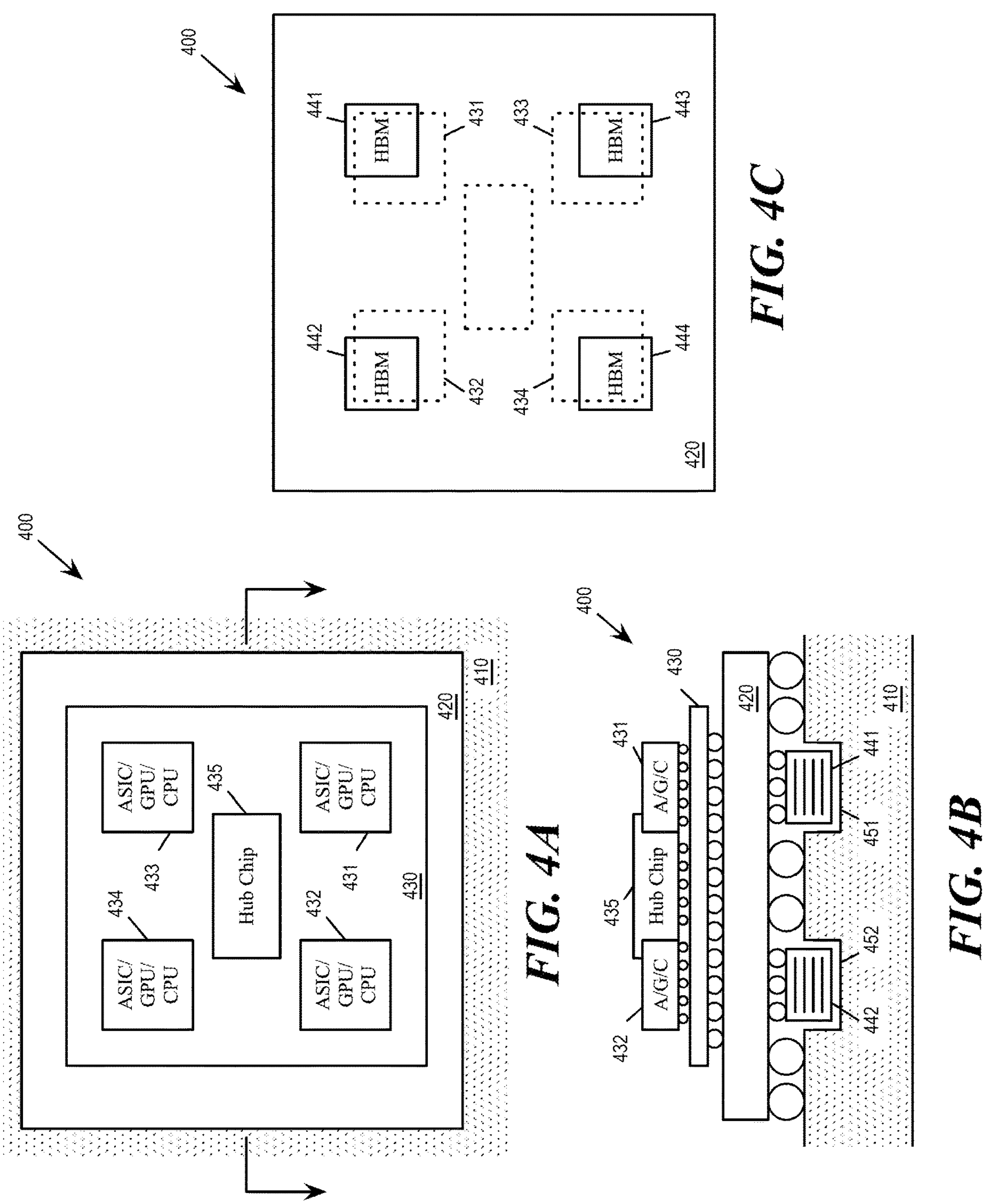
FIGS. 4A-C illustrate a packaged device in which back-mounted memory devices are used to provide storage capacity to front-mounted processing units, consistent with an illustrative embodiment.

FIGS. 4A-C illustrate a packaged device 400 in which back-mounted memory devices are used to provide storage capacity to front-mounted processing units. The packaged device 400 includes a standard density substrate 410 and a HDI substrate 420. Processing ICs 431-434 (CPUs/GPUs/ASICs) and a hub chip 435 are mounted on the top surface of the HDI substrate 420, and HBM modules 441-444 are mounted on the bottom surface of the higher density substrate. The HBM 441-444 provide storage to the processing unit 431-434, respectively.

FIG. 4A shows a top plan view of the packaged device 400. FIG. 4B shows a cross section view of the packaged device 400. As illustrated, the higher density substrate 420 is soldered onto the top surface of the lower/standard density substrate 410. A FOWLP structure 430 is mounted on the top surface of the higher density substrate 420, and the processing ICs 431-434 and the hub chip 435 are mounted on the FOWLP structure 430. The HBM modules 441-444 are mounted on the bottom surface of the higher density substrate 420. The HBM 441-444 respectively recess into cavities 451-454 (cavities 453 and 454 are hidden from view) at the top surface of the standard density substrate 410. Each HBM may be a chip stack of multiple ICs.

FIG. 4C shows a bottom view of the HDI substrate 420. The figure shows the positions of the four HBM modules 441-444. The figure also shows the positions of the four processing units 431-434 at the opposing side in dotted lines. Specifically, each processing unit has a corresponding HBM that is mounted at a position of the HDI substrate that overlaps or is near the processing unit. As illustrated, the footprint of the HBM 441 overlaps the footprint of the processing unit 431 at the opposing side, the footprint of the HBM 442 overlaps the footprint of the processing unit 432 at the opposing side, etc. In other words, each processing unit has its corresponding storage capacity right beneath it at the opposite side of the HDI substrate.

By using the back-mounted structure, the area of the laminate substrates (the HDI substrate 420 and the standard density substrate 410) can be reduced. In addition, by mounting the memory chips (HBMs) and the processing chips (CPUs/GPUs/ASICs) chips on the opposite side of the high-density laminate, the power constraint of the memory chips and the processing chips can be decoupled. The back-mounted structure also shortens the access paths from the processing chips to the memory chips since the memory chips are positioned right beneath the processing chips at the opposite side. This packaging technique also facilitates design of artificial intelligence/machine learning systems, whose processing units may require fine-grain access to high-density memories.

In some embodiments, the packaged device 400 is fabricated based on the following procedure: (1) providing a standard density laminate (e.g., standard build up layers) as the base substrate 410; (2) forming one or more cavities on the module mounting side of the base substate 410 according to the size and the height of an HBM; (3) bonding the HBMs 441-444 to the HDI substrate 420 and dispensing underfill (underfill can also be dispensed after the components are mounted on the top side of the HDI substrate 420 or pre-applied underfill can be used); (4) bonding one or more ASIC/CPU/GPU chips to the RDL layer of the FOWLP structure 430 and dispensing underfill; (5) placing the FOWLP structure 430 on the HDI substrate 420 and reflowed, or the FOWLP structure 430 can be placed onto the HDI substrate 420 after the HDI substrate is bonded to the base substrate 410; (6) placing the populated HDI substrate 420 on the base substrate 410, which has one or more cavities that match the height and size of the HBMs for recessing the HBMs; (7) reflowing C4 or micro-BGA solder onto the base substrate 410 (by e.g., ball mounting, ball jetting, etc.); (8) mounting the populated HDI substrate on the base substrate (by using e.g., belt furnace mass reflow.)

Figure 5:
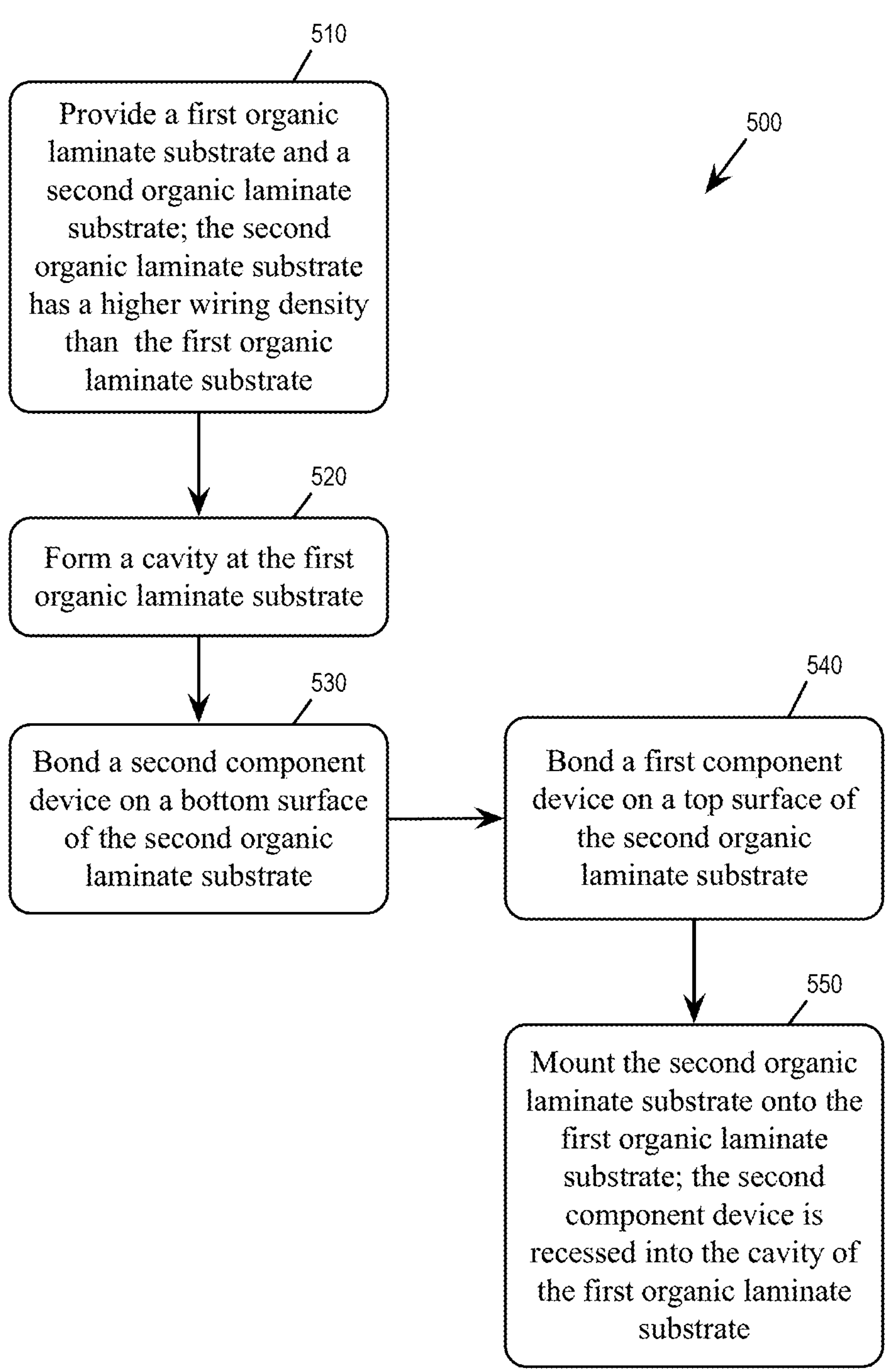
FIG. 5 conceptually illustrates a process for manufacturing a packaged device with back-mounted high-density laminate substrate, consistent with an illustrative embodiment.

FIG. 5 conceptually illustrates a process 500 for manufacturing a packaged device with back-mounted high-density laminate substrate, consistent with an illustrative embodiment.

At block 510, the process provides a first organic laminate substrate and a second organic laminate substrate. The second organic laminate substrate has a higher wiring density than the first organic laminate substrate. In some embodiments, the second organic laminate substrate is a high-density interconnect (HDI) laminate, and the first organic laminate substrate is a standard-density laminate comprising a set of standard build-up layers.

At block 520, the process forms a cavity at the first organic laminate substrate. The process forms a cavity at the first organic laminate substrate by chemical or mechanical etching. In some embodiments, the cavity is sized to match or accommodate the dimensions of the second component device (e.g., the height, width, and length of a HBM chip stack). In some embodiments, a heat conducting path is also installed into the first organic laminate substrate. the heat conducting path is exposed in the cavity to dissipate heat emitted by the second component device.

At block 530, the process bonds a second component device on a bottom surface of the second organic laminate substrate. At block 540, the process bonds a first component device on a top surface of the second organic laminate substrate. In some embodiments, the component device on the bottom of the second organic laminate substrate provides memory storage for the first component device. Specifically, in some embodiments, the first component device is a processing unit (CPU/GPU/ASIC) and the second component device is an HBM that provides storage capacity to a corresponding processing unit. In some embodiments, the second component device is mounted at a position of the second organic laminate substrate that overlaps the first component device. The first component device may be mounted onto an intermediate FOWLP with RDL.

At block 550, the process mounts the second organic laminate substrate onto the first organic laminate substrate. The second component device is recessed into the cavity of the first organic laminate substrate. In some embodiments, the second organic laminate substrate is soldered onto the first organic laminate substrate using control collapse of chip connection (C4) and ball grid array (BGA).

The flowchart in FIG. 5 illustrates the operation of possible implementations of systems, methods, or computer program products according to various embodiments of the present disclosure. In this regard, each block in the flowchart may represent a module, segment, or portion of instructions for implementing the specified operation(s). In some alternative implementations, the operations noted in the blocks may occur out of the order noted in the FIG. 5. For example, two blocks shown in succession may, in fact, be executed substantially concurrently, or the blocks may sometimes be executed in the reverse order, depending upon the operations involved.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A packaged device comprising:

a first organic laminate substrate;

a second organic laminate substrate that is joined onto a top surface of the first organic laminate substrate, wherein the second organic laminate substrate has a higher wiring density than the first organic laminate substrate;

a first component device mounted on a top surface of the second organic laminate substrate, the first component device including a fan out wafer level package (FOWLP) and multiple integrated circuits (ICs) that are mounted onto the FOWLP; and a second component device mounted on a bottom surface of the second organic laminate substrate and recesses into a first cavity at the top surface of the first organic laminate substrate, wherein the second component device has a lower power density than the first component device and is surrounded by the first organic laminate substrate at sidewalls and a bottom of the second component device.

2. The packaged device of claim 1, wherein the first organic laminate substrate is a laminate comprising a set of standard build-up layers and the second organic laminate substrate is a high-density interconnect (HDI) laminate.

3. The packaged device of claim 1, wherein the second component device is a chip stack comprising multiple integrated circuits (ICs); the first component device has a first thickness and the second component device has a second thickness; and the second thickness is thinner than the first thickness.

4. The packaged device of claim 1, wherein the first organic laminate substrate comprises a heat conducting path that is configured to dissipate heat from the first cavity emitted by the second component device, and wherein the first cavity in the first organic laminate substrate has a depth that is shallower than a thickness of the first organic laminate substrate.

5. The packaged device of claim 1, wherein the first component device is mounted on the top surface of the second organic laminate substrate at the FOWLP, the FOWLP further includes a fine pitch redistribution layer (RDL).

6. The packaged device of claim 1, wherein the second component device provides memory storage for the first component device.

7. The packaged device of claim 6, wherein the second component device is a high bandwidth memory (HBM) and the first component device is a central processing unit (CPU) or graphical processing unit (GPU).

8. The packaged device of claim 1, further comprising a conductive pillar directly contacting both a bottom surface of the second organic laminate substrate and a bottom surface of the first cavity, the conductive pillar being configured to supply power to the second organic laminate substrate from the first organic laminate substrate.

9. The packaged device of claim 1, wherein the second component device is mounted at a position of the second organic laminate substrate that overlaps the first component device.

10. The packaged device of claim 1, further comprising a third component device mounted at the bottom surface of the second organic laminate substrate and recesses into the first cavity at the top surface of the first organic laminate substrate, and a conductive pillar between the second component device and the third component device, the conductive pillar contacting the second organic laminate substrate and the first cavity.

11. The packaged device of claim 10, wherein the third component device provides memory storage for a fourth component device that is mounted on the second organic laminate substrate.

12. The packaged device of claim 1, wherein the second organic laminate substrate is soldered onto the first organic laminate substrate using control collapse of chip connection (C4) and ball grid array (BGA).

13. A method for fabricating a packaging device, the method comprising:

providing a first organic laminate substrate and a second organic laminate substrate joined onto a top surface of the first organic laminate substrate, wherein the second organic laminate substrate has a higher wiring density than the first organic laminate substrate;

bonding a first component device on a top surface of the second organic laminate substrate, the first component device including a fan out wafer level package (FOWLP) and multiple integrated circuits (ICs) that are mounted onto the FOWLP;

bonding a second component device on a bottom surface of the second organic laminate substrate;

forming a cavity at the top surface of the first organic laminate substrate; and mounting the second organic laminate substrate onto the first organic laminate substrate, wherein the second component device is recessed into the cavity of the first organic laminate substrate and has a lower power density than the first component device and is surrounded by the first organic laminate substrate at sidewalls and a bottom of the second component device.

14. A device comprising:

an organic laminate substrate;

a high density interconnect (HDI) on a top surface of the organic laminate substrate;

a first component device on a top surface of the HDI;

a second component device on a bottom surface of the HDI, the second component device recesses into a first cavity in the organic laminate substrate; and a conductive pillar having a first and a second end, the first end being in direct contact with the bottom surface of the HDI and the second end being in direct contact with a bottom surface of the first cavity.

15. The device of claim 14, wherein the first component device has a first thickness and the second component device has a second thickness that is thinner than the first thickness.

16. The device of claim 14, further comprising a third component device mounted at the bottom surface of the HDI, the third component device recesses into a second cavity of the organic laminate substrate.

17. The device of claim 16, wherein the first and the second cavity in the organic laminate substrate have a substantially same depth that is shallower than a thickness of the organic laminate substrate, the first and the second cavity do not extend to the bottom of the organic laminate substrate.

18. The device of claim 14, wherein the first component device includes a fan out wafer level package (FOWLP) and multiple integrated circuits (ICs), the multiple ICs are mounted onto the FOWLP, and the FOWLP includes a fine pitch redistribution layer (RDL).

19. The device of claim 14, wherein the conductive pillar provides power to the HDI from the organic laminate substrate.

20. The device of claim 14, further comprising a third component device mounted at the bottom surface of the HDI, the third component device recesses into the first cavity of the organic laminate substrate, and further comprising a conductive pillar vertically in direct contact with both the bottom surface of the HDI and a bottom surface of the first cavity, the second component device being at a first side of the conductive pillar and the third component device being at a second side, opposite the first side, of the conductive pillar.

* * * * *